United States Patent [19]

Park

[11] Patent Number: 5,098,867
[45] Date of Patent: Mar. 24, 1992

[54] HEAT TREATMENT FOR COMPOUND SEMICONDUCTOR WAFER

[75] Inventor: Joo S. Park, Suweon, Rep. of Korea

[73] Assignee: Samsung Electronics Co., Ltd., Suweon, Rep. of Korea

[21] Appl. No.: 612,573

[22] Filed: Nov. 13, 1990

[51] Int. Cl.⁵ .......................................... H01L 21/324
[52] U.S. Cl. .................................. 437/247; 437/939; 437/945; 437/949; 437/963; 156/DIG. 73
[58] Field of Search .............. 437/247, 939, 945, 949, 437/963, 964; 422/245, 248; 156/DIG. 23

[56] References Cited

U.S. PATENT DOCUMENTS

| | | | |
|---|---|---|---|
| 3,649,193 | 3/1972 | Deyris | 422/248 |
| 3,783,825 | 1/1974 | Kobayasi et al. | 422/245 |
| 4,312,681 | 1/1982 | Rupprecht et al. | 437/247 |
| 4,317,689 | 3/1982 | Bowers et al. | 156/DIG. 73 |
| 4,820,651 | 4/1989 | Prince et al. | 437/247 |

Primary Examiner—Robert Kunemund
Attorney, Agent, or Firm—Ladas & Parry

[57] ABSTRACT

A compound semiconductor wafer wherein arsenide deposit is included with uniform size and distribution in such a manner that a compound reagent of gallium and polycrystal gallium arsenide is melted at 600°~700° C. for 1~5 hours and such a reagent is contacted with a gallium arsenide wafer at above 900° C. for 2~5 hours so arsenide to make the unevenly distributed arsenide deposit uniform and maintain such an arsenide deposit at 600°~700° C. for 5~30 hours, thereby removing thermal stress therefrom.

11 Claims, 1 Drawing Sheet

HEAT TREATMENT FOR COMPOUND SEMICONDUCTOR WAFER

BACKGROUND OF THE INVENTION

The present invention relates to a heat treatment for a compound semiconductor wafer, particularly including volatile elements.

Recently, the necessity of ultrahigh speed computers, ultrahigh frequency and optical communication, etc. has gradually increased in response to the tendency toward the information-communication society. Therefore, much investigation has been performed on compound semiconductors which have superior material properties, conventional semiconductor devices made of Silicon can not meet this necessity.

For example, when Gallium arsenide ingot is grown, defects such as dislocation, vacancy, interstitial atoms, and arsenide deposits are produced inside a crystal randomly so that the characteristics of a device which is fabricated by means of a wafer made of the ingot grown by a conventional LEC(Liquid Encapsulated Czochralski) method are not uniform, thereby degrading the reliability of the device. Thus, heat treatment is applied to the wafer to improve the defects and to provide uniform electrical characteristics.

FIG. 1 shows a schematic diagram illustrating a conventional method of heat treatment for a compound semiconductor wafer. First, protecting wafers 3 are contacted with both sides of a process wafer 1. The process and protecting wafers 1 and 3 are located in a quartz tube 7 together with excess reagent.

The quartz tube 7 is maintained in a vacuum state and sealed up. Subsequently the, inside of the quartz tube 7 is maintained at 800°~900° C. for several minutes to hours by a heater 9 and subsequently cooled. During the heat treatment, dissociation of arsenide can easily occur since the volatile temperature of arsenic is much lower than that of gallium in the gallium arsenide wafer.

Thus, the tube 7 is in arsenic atmosphere by using the arsenide as excess reagent 5 to suppress the dissociation of arsenide from the wafer 1, and the protecting wafers 3 not only suppress the dissociation of arsenide from the wafer 1 but also provide arsenide to the thermal processing wafer 1. The vacuum of the tube 7 is maintained in order to prevent the oxidation and the contamination of the wafer 1 during the heat treatment.

The heat treatment is carried out in such a manner that the composition of arsenide in the wafer 1 is controlled by a gas pressure of the tube 7 maintained in arsenic atmosphere. Before the heat treatment, however, the arsenide deposit is randomly distributed on the wafer 1. Therefore, there is a problem in carrying out the dissociation and internal diffusion of arsenide uniformly on the surface of the wafer 1 during the heat treatment. Also, the surface becomes rough and defects such as vacancy are generated unevenly on the surface of the wafer 1.

SUMMARY OF THE INVENTION

The present invention has an object to provide a heat treatment method of a compound semiconductor wafer which can distribute arsenide deposit uniformly on the surface and inside of the wafer.

Another object of the present invention is to provide a heat treatment for a compound semiconductor wafer which can improve defects such as bad topography and vacancy distributed unevenly on the surface and inside of the wafer.

According to the present invention, there is provided a heat treatment for a compound semiconductor wafer including high-volatile elements, comprising the steps of: locating a compound semiconductor wafer in a groove of a slider and a reagent in a well of a holder, and melting the reagent in the well of the holder by a first heating after sealing-up the well of the holder; moving the slider to reconcile the groove thereof with the well of the holder and making the surface of the compound semiconductor wafer uniformly smooth by a second heating after covering the entire surface of the compound semiconductor wafer with the melted reagent; and removing thermal stress by a third heating, after separating the groove from the well and cooling the compound semiconductor wafer to a normal temperature.

BRIEF DESCRIPTION OF THE DRAWINGS

These and other objects, features, and advantages of the present invention will become more apparent from the following description for the preferred embodiments taken in conjunction with the accompanying drawings, in which.

DETAILED DESCRIPTION OF THE PREFERRED EMBODIMENT

The present invention will now be described in more detail with reference to the accompanying drawings.

Figure 1:
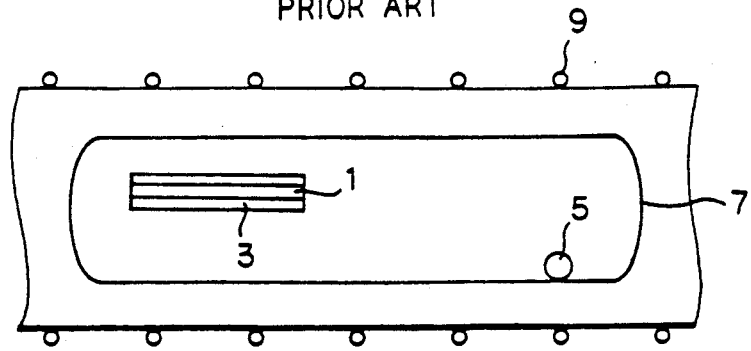
FIG. 1 is a schematic diagram for explaining a conventional heat treatment method of semi-insulating gallium arsenide wafer.
Figure 2A:
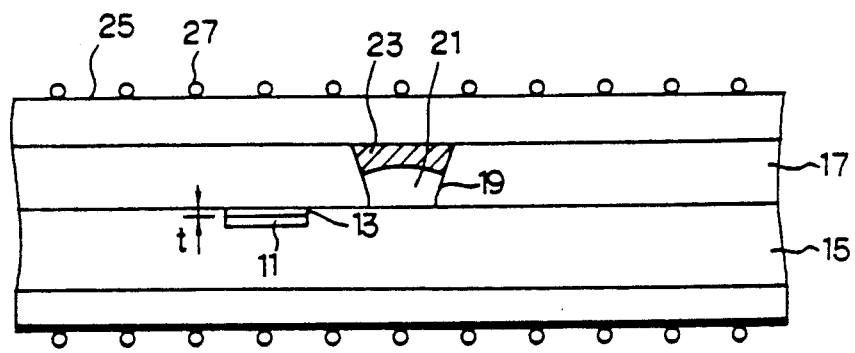
FIGS. 2(A)~(C) are schematic diagrams for explaining a heat treatment method of semi-insulating gallium arsenide wafer according to the present invention.
Figure 2B:
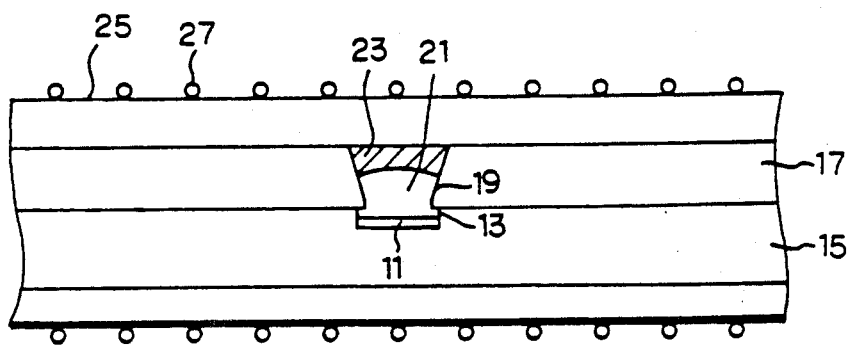
Figure 2C:
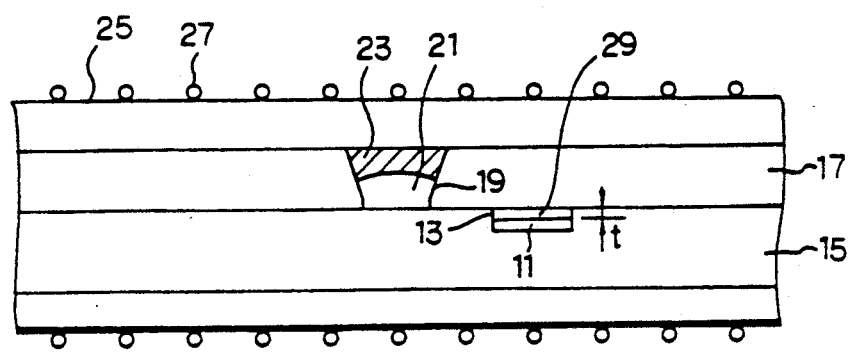

FIGS. 2(A)~(C) show steps of the heat treatment according to the present invention. As shown in FIG. 2(A), a semi-insulating gallium arsenide wafer 11 is located in a groove 13 of a slider 15 after a cleaning process and a reagent 21 which is a mixture of gallium and polycrystal gallium arsenide at a proper ratio of 10 g to 300~1000 mg is filled up in a well 19 of a holder 17. So as, to maintain the stoichiometry of the gallium arsenide wafer.

Next, the well 19 is sealed up by a sealing material 23 and subsequently located into a reaction tube 25 of an electrical furnace. The wafer 11 is located in the groove 13 of a slider 15 with an air gap of about 50 μm. Also, the outside of the reaction tube 25 is wound by a heating coil 27 to maintain a uniform temperature. The reaction tube 25 is heated at about 600°~700° C. for 1~5 hours by the heating coil 27. Then, the reagent 21 is melted and the gallium oxide included in gallium is slagged by the sealing material 23.

On the other hand, boron oxide is used as the sealing material. Boron oxide containing $H_2O$ in an amount of only 200~400 ppm may be used to reduce the amount of gallium oxide which is produced by the reaction of oxygen with the melted reagent 21.

If the groove 13 is reconciled with the well 19 by moving the slider 15, the melted reagent 21 covers the surface of the wafer 11 shown in FIG. 2(B). Next, the temperature is maintained continuously at above 900° C. for 2-5 hours and then arsenide deposite which were distributed on the surface of the wafer 11 are melted again.

Now, referring to FIG. 2(C), the slider 15 is moved into a predetermined position to separate the groove 13 from the well 19 and the wafer 11 is cooled down to the normal temperature at a rate of 300°~1200° C./hr. Then, an epitaxial layer 29 is formed on the surface of the wafer 11 and has the same thickness (t) with that of the air gap.

In such a process, the diffusion time of arsenide can be minimized and thus the arsenide is deposited with a small and uniform size since the epitaxial layer 29 is formed with a fast cooling rate. But, residual thermal stress in the heat treatment is increased between the epitaxial layer 29 and the wafer 11 during the fast cooling process. Thus, in order to remove the thermal stress between the epitaxial layer 29 and the wafer 11, the heating coil 27 is maintained on at about 600°~700° C. for 5~30 hours continuously.

In this process, arsenide is diffused centering around an Arsenide nucleus deposited during the fast cooling process, forming the Arsenide deposit with a uniform small size. Subsequently, after cooling again the wafer 11, the epitaxial layer 29 is removed by a polishing process, providing the wafer with a good mirror surface. Also, the vacancy distributed unevenly on the surface and inside of the wafer 11 and the bad topography are improved during the above mentioned heating process.

As mentioned heretofore, the present invention performs the heat treatment for a gallium arsenide compound wafer by using the liquid phase of gallium solution which is melted out from polycrystal gallium arsenide so that the abovementioned defects are removed and the arsenide deposite at the surface and inside of the gallium arsenide wafer becomes uniform, thereby improving the uniformity of electric characteristics. Even though the present invention is described only for Gallium arsenide, it is also applicable to indium arsenide, indium phosphide and gallium phosphide.

The invention is in no way limited to the embodiment described hereinabove. Various modifications of disclosed embodiment as well arsenide other embodiments of the invention will become apparent to persons skilled in the art upon reference to the description of the invention. It is therefore contemplated that the appended claims will cover any such modifications or embodiments as fall within the true scope of the invention.

What is claimed is:

1. A method for heat treatment of a compound semiconductor wafer having a nonuniform surface, said wafer including high-volatile elements, said method comprising the steps of:

a. positioning the compound semiconductor wafer in a groove of a slider and a reagent in a well of a holder, and melting the reagent in the well of the holder by a first heating after sealing-up the well of the holder;

b. moving the slider to reconcile the groove thereof with the well of the holder, covering the entire surface of the compound semiconductor wafer with the melted reagent and subjecting the semiconductor wafer covered with the melted reagent to a second heating for a time and at a temperature sufficient to cause uniform distribution of the reagent on the surface of the semiconductor wafer; and c. separating the groove from the well and cooling the compound semiconductor wafer with the reagent distributed thereon at a rate and to a temperature at which the reagent forms an epitaxial layer on the semiconductor wafer which renders the surface of the semiconductor wafer uniform.

2. A method according to claim 1, wherein the sealing material comprises boron oxide.

3. A method according to claim 2, wherein the sealing material further comprises $H_2O$ in an amount of about 200-400 ppm.

4. A method according to claim 1, wherein the first heating is carried out at 600°~700° C. for 1~5 hours.

5. A method according to claim 1, wherein the second heating is carried out at above 900° C. for 2~5 hours.

6. A method according to claim 1, wherein the wafer is cooled down in step c at a rate of 300°-1200° C./hr.

7. A method according to claim 1, wherein the wafer is made of a compound semiconductor material selected from elements from groups III-V of the Periodic Table.

8. A method according to claim 7, wherein the compound semiconductor wafer is selected from the group consisting of gallium arsenide, indium arsenide, gallium phosphide and indium phosphide.

9. A method according to claim 1 wherein the composition of the reagent is such that the composition of the epitaxial layer formed by said heat treatment is substantially the same as the composition of the semiconductor wafer in step a.

10. A method according to claim 1, wherein in step a, the reagent is a mixture of gallium and polycrystal gallium arsenide at a ratio of 10 g to 300-1000 mg.

11. A method according to claim 1 further comprising subjecting the semiconductor wafer produced in step c to a third heating step to alleviate thermal stress within the semiconductor wafer of step c.

* * * * *